United States Patent [19]

Chandra et al.

[11] Patent Number: 5,059,448
[45] Date of Patent: Oct. 22, 1991

[54] RAPID THERMAL PROCESS FOR OBTAINING SILICA COATINGS

[75] Inventors: Grish Chandra; Theresa E. Martin, both of Midland, Mich.

[73] Assignee: Dow Corning Corporation, Midland, Mich.

[21] Appl. No.: 539,249

[22] Filed: Jun. 18, 1990

[51] Int. Cl.$^5$ .......................... B05D 3/06; B05D 5/12; H01L 21/2
[52] U.S. Cl. .................................. 427/53.1; 427/54.1; 427/55; 427/126.2; 427/126.3; 427/126.4; 437/238; 437/235
[58] Field of Search ...................... 427/53.1, 54.1, 55, 427/56.1, 126.2, 126.3, 126.4, 126.5; 437/238, 235

[56] References Cited

U.S. PATENT DOCUMENTS

| | | | |
|---|---|---|---|
| 4,753,855 | 6/1988 | Haluska et al. | 427/58 |
| 4,822,697 | 4/1989 | Haluska et al. | 427/53.1 |
| 4,847,162 | 7/1989 | Haluska et al. | 427/58 |
| 4,849,296 | 7/1989 | Haluska et al. | 427/58 |
| 4,885,186 | 12/1989 | Bagley et al. | 427/38 |
| 4,911,942 | 3/1990 | Haluska et al. | 427/58 |
| 4,973,526 | 11/1990 | Haluska | 427/38 |

OTHER PUBLICATIONS

Singh, J. Appl. Phys., 63(8) R59-R114 (1988), "Renal Isothermal Processor".
"Rapid Thermal Process Selection Guide", Microelectronic Manufacturing and Testing, pp. 38-41 (1989).
Semiconductor International, Sep. 1989, p. 26, "British Study Effects of RTA on Processor on CMOS Devices", no author.
"Curing of Spin-On Glass Films by Rapid Thermal Anneal", Lassig et al., Peak systems Report.
Wilson et al., Mat. Res. Soc. Symp. Proc., vol. 52 (1986).
Singer, Semiconductor International, Mar. 1989.
Leavitt, *Semiconductor International* Mar. 1987, "Rapid Thermal Processing".
AG Associates, *Solid State Technol*, Nov. 1989, pp. 55-56, no author.

Primary Examiner—Shrive Beck
Assistant Examiner—Marianne L. Padgett
Attorney, Agent, or Firm—Roger E. Gobrogge

[57] ABSTRACT

The present invention is based on the discovery that rapid thermal processing (RTP) can convert hydrogen silsesquioxane resin coatings to ceramic silica coatings. This technique is especially valuable for the application of protective and dielectric layers on electronic devices.

23 Claims, No Drawings

RAPID THERMAL PROCESS FOR OBTAINING SILICA COATINGS

BACKGROUND OF THE INVENTION

The present invention is based on the discovery that rapid thermal processing (RTP) can convert hydrogen silsesquioxane resin coatings to ceramic silica coatings. This technique is especially valuable for forming protective and dielectric silica layers on electronic devices.

The use of thin film ceramic silica coatings as protective and dielectric layers for electronic devices is known in the art. For instance, U.S. Pat. No. 4,756,977 describes the use of hydrogen silsesquioxane resin derived silica coatings on various substrates including electronic devices. This patent teaches that such substrates may be coated by applying a hydrogen silsesquioxane resin solution to the substrate, evaporating the solvent to deposit a preceramic coating, and then heating to temperatures of 150°-1000° C. in a conventional furnace. The coatings formed thereby provide excellent environmental protection to the underlying substrate and effectively inhibit electrical conduction.

In spite of their efficacy, these conventional methods require the use of a high thermal budget (temperature × time) for the oxidation and densification of hydrogen silsesquioxane resin. Such high thermal budgets are not acceptable in many temperature sensitive applications as they may damage or destroy the substrate. This is especially true in the electronic industry where recent advances to reduce device dimensions and increase the number of circuits per wafer put severe constraints on the thermal processing to which a wafer may be subjected.

In an attempt to decrease the thermal budget for hydrogen silsesquioxane resin, researchers have developed various low temperature conversion methods.

Rapid thermal processing (RTP) is a technique for decreasing the thermal budget of a substrate by decreasing the time the substrate is at the elevated temperature. This technique uses high intensity radiation to rapidly heat (50°-300° C./sec) the thin coatings to an elevated temperature for a time which allows the desired physical or chemical processes to be completed but not allow the substrate to be adversely affected. As such, this technique has found applications in the electronics industry including, for example, improving the crystalline quality of semiconductors, annealing ion-implanted single-crystal silicon, annealing ion-implanted polycrystalline silicon, annealing ionimplanted compound semiconductors, annealing metal-semiconductor contacts, forming silicides, forming and annealing dielectrics, and reflowing passivating glasses.

Singh in J. Appl. Phys. 63 (8), 15 Apr. 1988 provides a thorough review of rapid isothermal processing (a synonym for RTP), its mechanism and various applications. Included therein is its use in the formation of thermally grown $SiO_2$ layers. This reference, however, fails to describe hydrogen silsesquioxane resin as the source of silica.

Similarly, Lassig et al. of Peak Systems, Inc. have described the conversion of various spin-on glass films to $SiO_2$ coatings by the use of RTP. As with the Singh reference, Lassig et al. fail to describe the use of hydrogen silsesquioxane resin as the source of silica.

The inventors herein have now unexpectedly found that RTP can be used to rapidly convert hydrogen silsesquioxane resin to silica coatings with desirable characteristics such as high density and low film stress

SUMMARY OR THE INVENTION

This invention relates to a method of applying a silica coating to a substrate. The method comprises coating the substrate with a solution comprising hydrogen silsesquioxane resin and a solvent. The solvent is evaporated to deposit a hydrogen silsesquioxane resin coating. The coated substrate is then exposed to high intensity radiation comprising incoherent light in a spectral region selected from the group consisting of visible, infrared, ultraviolet and combinations thereof, in order to heat said coated substrate sufficiently to facilitate conversion of said hydrogen silsesquioxane resin coating to a silica coating.

DETAILED DESCRIPTION OF THE INVENTION

This invention is based on the discovery that rapid thermal processing (RTP) can be used to rapidly convert hydrogen silsesquioxane resin (H-resin) coatings to silica coatings at a low thermal budget. This rapid conversion was particularly unexpected, especially since the art teaches that extended periods of time (i.e., generally > 1 hour) are required for the conversion of Si—H bonds to Si—OH and the condensation of this material to silica. Moreover, nothing in the art suggests that RTP could reduce the Si—H oxidation time to the order of seconds or minutes.

The fundamental concept behind RTP is that radiative heating and cooling of coatings on thermally isolated substrates allows for rapid and uniform temperature changes such that the thermal budget is decreased to a point where desired reactions occur in the coating without undesired harmful reactions occurring in the substrate. To achieve this, the substrate and coatings are heated to and maintained at a desired temperature with high intensity radiation comprising incoherent light in the visible, infrared and/or ultraviolet region (wavelength about 0.1 to 4 micrometers). The high intensity radiation is discontinued after the desired heating time has elapsed and the coated substrate is allowed to cool by radiation into the environment. The above heating and cooling occurs in a controlled environment (temperature, pressure and atmosphere) wherein the substrate is thermally isolated by a means which has a low thermal mass and very low thermal conductivity.

It has now been found that this concept can be used for the application of H-resin derived silica coatings. In this process, a high intensity radiation source is used to heat a preceramic Hresin coating (at about 30° to about 500° C. per second) to a temperature sufficient for silica conversion (above about 200° C.) and maintain the temperature for a time sufficient for silica conversion (greater than about 1 second) yet insufficient to damage the substrate. The radiation is then discontinued and the coated substrate allowed to cool. By this method, a planarizing, crackfree silica coating is rapidly formed without adversely affecting the substrate. Moreover, since a controlled environment is used, reactive gases such as oxygen, wet or dry ammonia or amines may be introduced to assist in silica conversion.

The rapid thermal process also has numerous other advantages over conventional furnace pyrolysis. For instance, 1) the process is relatively inexpensive. The cost of the RTP systems described herein can be modest compared with other more conventional pyrolysis equipment. 2) The process is relatively energy efficient. This effect results from the relatively efficient conversion of electricity to high intensity radiation and the direct coupling of the thermal energy to the substrate. 3) The process provides a means for high throughput of substrates. This advantage results from the short time necessary for processing and, therefore, allows for the adaptation of this process to mass manufacturing.

Likewise, the coatings produced by this technology have many desirable characteristics over conventional furnace fired coatings, 1) The amount of film stress produced by this process is significantly reduced over that of conventional furnace processing. As discussed herein, this effect results from the coating heating from the substrate outward, thereby allowing volatiles to escape. 2) Electronic devices coated in this manner have a) minimal bond strength loss at the bond welds (bond pull), b) decreased development of Hillock growths and c) decreased formation of intermetallics at the bond welds (purple plague). 3) The performance of electronic devices coated in this manner is not altered. Conventional processing with high thermal budgets, on the other hand, can adversely effect device function. 4) The coatings produced using RTP are generally more dense than those generated using conventional techniques. As such, the coatings provide superior protection and dielectric effects.

Because of the above processing and product-related advantages, the methods of this invention are particularly valuable for the deposition of protective or dielectric coatings on electronic devices, electronic circuits or plastics including, for example, polyimides, epoxies, polytetrafluoroethylene and copolymers thereof, polycarbonates, acrylics and polyesters. However, the choice of substrates and devices to be coated by the instant invention is limited only by the need for thermal and chemical stability of the substrate under the conditions used for RTP. The coatings taught herein also may serve as interlevel dielectric layers, doped dielectric layers to produce transistor like devices, pigment loaded binder systems containing silicon to produce capacitor and capacitor like devices, multilayer devices, 3-D devices, silicon on insulator devices, coatings for superconductors, super lattice devices and the like.

As used in the present invention, the expression "silica" ($SiO_2$) includes both amorphous silica as well as amorphous silicalike materials that are not fully free of residual carbon, silanol (Si-OH) and/or hydrogen. In addition, this "silica" may contain up to 30 weight percent of a modifying ceramic oxide as described infra. Such silica or silica-like materials may have variable densities depending on the temperature and time used for silica conversion; the expressions "hydrogen silsesquioxane resin" or "Hresin" are meant to include those hydridosilane resins which are fully condensed ($HSiO_{3/2})_n$ as well as those which are only partially hydrolyzed and/or partially condensed and, thereby, may contain residual SiOR and/or SiOH substituents; and the expressions "electronic device" or "electronic circuit" include, but are not limited to, silicon based devices, gallium arsenide based devices, focal plane arrays, opto-electronic devices, photovoltaic cells and optical devices.

As defined above, the hydrogen silsesquioxane resin used in this invention includes those which are fully condensed as well as those which are only partially hydrolyzed and/or condensed. Exemplary of fully condensed H-resins are those formed by the process of Frye et al. in U.S. Pat. No. 3,615,272 which is incorporated herein by reference. This polymeric material has units of the formula $(HSiO_{3/2})_n$ in which n is generally 8-1000. The resin has a number average molecular weight of from about 800-2900 and a weight average molecular weight of between about 8000-28.000. When heated sufficiently, this material yields a ceramic silica coating essentially free of SiH bonds. Though this material is described as fully condensed, recent analysis has confirmed that up to 100-200 ppm silanol may be present.

Exemplary H-resins which may not be fully condensed (polymers containing units of the formula $HSi(OH)_aO_{3-a/2}$, wherein a=0-2) are those of Bank et al. in U.S. patent application No. 07/401,726 or those of Frye et al. in U.S. patent application No. 07/386,450, both of which are incorporated herein by reference. Bank et al. describe a process which comprises hydrolyzing hydridosilanes in an arylsulfonic acid hydrate hydrolysis medium to form a resin, which is then contacted with a neutralizing agent. Recent experimentation has shown that an especially preferred H-resin which forms substantially crack-free coatings may be prepared by this method in which the acid/silane ratio is greater than about 2.67:1, preferably about 6/1. Frye et al. describe a process which comprises hydrolyzing trichlorosilane in a non-sulfur containing polar organic solvent by the addition of water or HCl and a metal oxide. The metal oxide therein acts as a HCl scavenger and, thereby, serves as a continuous source of water.

Exemplary H-resin which is not fully hydrolyzed or condensed is that of Baney et al. in U.S. patent application No. 07/483.525, which is incorporated herein by reference. This application describes soluble polymers having units of the formula $HSi(OH)_x(OR)_yO_{z/2}$, in which each R is independently an organic group which, when bonded to silicon through the oxygen atom, forms a hydrolyzable substituent, x=0-2, y=0-2, z=1-3, x+y+z=3 and the average value of y over all of the units of the polymer is greater than 0. Examples of R groups in the above equation include alkyls of 1-6 carbon atoms such as methyl, ethyl, propyl etc., aryls such as phenyl and alkenyls such as vinyl. As described in the application, these resins may be formed by a process which comprises hydrolyzing a hydrocarbonoxy hydridosilane with water in an acidified oxygen-containing polar organic solvent.

The above H-resin is dissolved in a solvent to form a solution for application. Various facilitating measures such as stirring and/or heating may be used in the dissolution to more effectively dissolve the H-resin and create a more uniform solution. The solvent can be any agent or mixture of agents which will dissolve the H-resin to form a homogenous solution without affecting the ceramic coating. These solvents can include, for example, alcohols such as ethyl or isopropyl, aromatic hydrocarbons such as benzene or toluene, alkanes such as n-heptane or dodecane, ketones, esters, glycol ethers, or cyclic dimethylsiloxanes, in an amount sufficient to dissolve the above materials to low solids. Generally, enough of the above solvent is used to form a 0.1-50 weight percent solution.

Besides the H-resin, the coating solution may also include a modifying ceramic oxide precursor. The modifying ceramic oxide precursors that can be used herein include compounds of various metals such as aluminum, titanium, zirconium, tantalum, niobium and/or vanadium as well as various non-metallic compounds such as those of boron or phosphorous. The expression "modifying ceramic oxide precursor", therefore, includes such metal and non-metal compounds having one or more hydrolyzable groups bonded to the above metal or non-metal. Examples of hydrolyzable groups include, but are not limited to, alkoxy, such as methoxy, ethoxy, propoxy etc., acyloxy, such as acetoxy, or other organic groups bonded to said metal or non-metal through an oxygen. These compositions must form soluble solutions when mixed with the silica precursors and must be capable of being hydrolyzed, and subsequently pyrolyzed, at relatively low temperatures and relatively rapid reaction rates to form modifying ceramic oxide coatings. When such a modifying ceramic oxide precursor is used, it is generally present in the preceramic mixture in an amount such that the final ceramic coating contains 0.1 to 30 percent by weight modifying ceramic oxide.

Examples of modifying ceramic oxide precursors include tetra n-propoxy zirconium, tetraisobutoxy titanium, aluminum trispentanedionate, pentaethoxy tantalum, tripropoxy vanadium, pentaethoxy niobium, zirconium pentanedionate, and titanium dibutoxy bispentanedionate.

If modifying ceramic oxide precursors are to be included in an H-resin preceramic solution, they may be simply dissolved in the solution comprising the H-resin and the solvent and allowed to stand at room temperature for a time sufficient to allow the modifying ceramic oxide precursor to react into the structure of the H-resin. Generally, a period of greater than about 2 hours is necessary for said reaction to occur. The solution may then be applied to the substrate as discussed infra. Alternatively, the modifying ceramic oxide precursor may be hydrolyzed or partially hydrolyzed, dissolved in the solution comprising the solvent and H-resin and then immediately applied to the substrate. Various facilitating measures such as stirring or agitation may be used as necessary to produce said solutions.

A platinum or rhodium catalyst may optionally be included in the solution t increase the rate and extent of silica formation. Generally, any platinum or rhodium compound or complex that can be solubilized in this solution will be functional. For instance, an organoplatinum composition such as platinum acetylacetonate or rhodium catalyst $RhCl_3[S(CH_2CH_2CH_2CH_3)_2]_3$, obtained from Dow Corning Corporation, Midland, Mich. are all within the scope of this invention. These catalysts are generally added to the solution in an amount of between about 5 to 500 ppm platinum or rhodium based on the weight of H-resin in solution.

The solution comprising the H-resin, solvent, and, optionally, a modifying ceramic oxide precursor and/or a platinum or rhodium catalyst is then coated onto the substrate. The method of coating can be, but is not limited to, spin coating, dip coating, spray coating or flow coating. Other equivalent means, however, are also deemed to be within the scope of this invention.

The solvent is allowed to evaporate from the coated substrate to result in the deposition of a preceramic coating. Any suitable means of evaporation may be used such as simple air drying by exposure to an ambient environment or by the application of a vacuum or mild heat. It is to be noted that when spin coating is used, an additional drying period is generally not necessary as the spinning drives off the solvent.

The above coating is then converted to silica using RTP. Though numerous RTP systems are commercially available and functional herein, generally they comprise five basic elements: 1) one or more heat sources which cause the coating to heat quickly and uniformly. 2) a means of holding the sample which has a low thermal mass and very low thermal conductivity so that temperature gradients are not produced across the wafer, 3) a means for precisely monitoring temperature. 4) a mechanism for transporting the sample in and out of the processing system, and 5) a controlled environment for pyrolysis and cooling.

The heat sources used in RTP systems emit radiation in a wavelenth of about 0.1 to about 4.0 micrometers and, thus, cover the ultraviolet, infrared and visible light regions. This radiation should be of sufficient intensity to rapidly heat the coatings, preferably at a rate of at least about 30°-500° C./sec. The usual source of such radiation is generally either tungsten halogen lamps, arc lamps or graphite heaters, but other sources which function in an equivalent manner are also deemed to be within the scope of this invention. Each of these sources has its own set of advantages/disadvantages which the user must chose between. Of these, however, the wavelength of radiation appears to be most critical. It has been found that those sources with a wavelength less than about 1.4 micrometers couple most efficiently with silicon and, therefore, have a high conversion of input power into usable radiation. Those heat sources with wavelengths above 1.4 micrometers (more infrared absorption—i.e.. closer to conventional furnace heating), on the other hand, are less efficient since they heat predominantly by free carrier absorption.

The above differentiation in wavelengths is important from a practical standpoint since those sources which couple efficiently with silicon tend to heat the coating from the substrate outward, thereby allowing volatiles to escape and the film stress to be decreased. Heat sources which rely on free carrier absorption, on the other hand, heat from the surface of the coating inward trapping volatiles and increasing film stress. Since film stress appears to play a major role in determining the efficacy of coatings on electronic devices, this factor should be carefully considered.

Tungsten lamps have been used for many years in numerous lighting and heating applications. They emit radiation in the 0.4 to 4 micrometer range and have a peak intensity between 0.5 and 1 micrometer. Since these lamps are generally rated at only a few kilowatts each, an arrays of lamps is usually necessary to uniformly heat an entire wafer at the desired rate. These lamps are especially advantageous in that they are reliable and relatively inexpensive to purchase and operate.

Arc lamps are also a popular heat source. They generally have a spectral radiation in the range of less than about 1 micrometer and, therefore, more directly couple with silicon (about 70%). They have a microsecond response because of the low thermal mass and, therefore, have faster ramp-ups (the rate at which the coating is heated). Since these lamps are generally rated at about 35-100 kilowatts each, only one lamp is generally required and a wider steady state temperature range is possible. Arc lamps are, however, generally more expensive and less reliable than tungsten lamps.

A graphite heating element can also be used as a heat source for RTP. In a typical graphite system, the heating element is usually preheated to between about 1000° and about 1400° C. (in a vacuum to prevent oxidation of the heater) and the radiation therefrom intensified by the use of a series of reflectors. The coated substrate is then placed in the pyrolysis chamber which is separated from the heat source by a shutter means. The shutter is opened to allow rapid exposure to the radiation and closed to allow cooling. The radiation from this source is primarily in the infrared region and, therefore, the coupling of radiation is primarily by free carrier absorption.

The means of holding the sample is important to insure uniformity of heating and cooling. If nonuniformity in temperature occurs, the coating and/or underlying substrate may be adversely effected. As such, the holding means should be of low thermal mass to prevent generating thermal gradients and even lower thermal conductivity to inhibit conducting heat away from the substrate. Quartz devices such as pins or holders are generally used for this purpose but any equivalent means would also function herein.

A means of reliably measuring temperature is critically important to RTP, especially since small effects on the thermal budget may adversely affect the substrate. Factors such as the rapid temperature changes and the wide variety of steady state temperatures can make such measurements difficult. Generally, most systems use a pyrometer (infrared or optical), a thermocouple or both. Other equivalent methods, however, would functional as well. The pyrometer or thermocouple are generally used in a closed loop system in which a computer receives measurements and automatically controls radiation levels, wafer temperatures, time at temperature and ramp rates.

The mechanism for transporting the sample into and out of the system can be by any practical means. For example, a manual system of placing the substrate on the holding means or an automated system such as a conventional conveyor system or a robotic device may be used herein. Such transporting means should not introduce contamination nor detrimentally effect the coatings.

The RTP heating and cooling is generally conducted in a controlled environment process chamber which allows for optimized, uniform, and reproducible processing. For instance, the temperature of the pyrolysis chamber walls must be carefully regulated to prevent thermal gradients in the wafers and to avoid a gradual rise in temperature as a series of wafers are heated. Moreover, the process gas (i.e., oxygen, ammonia etc.) and/or atmospheric pressure must be optimized and maintained in the chamber to insure effective silica formation. In addition, however, the controlled environment also prevents the substrate from being contaminated and, thereby, avoids undesirable coatings.

During a standard procedure, the coated substrate is introduced into the pyrolysis chamber, the incoherent light source is applied such that the temperature of the coating is rapidly ramped up to that desired, the temperature is maintained for a given period of time, the source of radiation is discontinued, the coated substrate is rapidly cooled by radiation and the coated substrate is removed from the pyrolysis chamber.

It is also contemplated that RTP can be used as a single step in a coating forming process. For instance, it is contemplated herein that the hydrogen silsesquioxane resin coating may be first hydrolyzed using, for example, a wet ammonia environment and subsequently heated using the RTP process.

The temperature to be used in the above process is one which is effective for the conversion of H-resin to silica. Generally, higher temperatures will provide faster results, but the duration of exposure to such temperatures must be carefully monitored to prevent a thermal budget which alters the substrate. Temperatures in the range of about 50° to about 1000° C. are usually used and temperatures in the range of about 300° to about 900° C. are preferred.

The time for exposure to the above temperature is one which is sufficient for silica conversion yet insufficient to adversely affect the substrate. As stated above, higher temperatures usually require shorter exposures. Generally exposure times in the range of about 1 second up to about 1 hour are adequate for the above temperature range and temperatures in the range of about 1 second up to about 15 minutes are preferred.

The process gas and atmospheric pressure used in the process chamber is not critical and can be any environment which is conducive to silica formation. Pressures from a vacuum up to superatmospheric are functional herein and reactive gases such as air, oxygen, ammonia, amines etc. may all be used. Though some oxygen is generally necessary for the conversion of H-resin to silica, heating in an oxygen free environment usually results in the formation of a ceramic coating of undetermined structure which also possesses desirable characteristics.

By the above methods, a thin (less than 2 microns) ceramic planarizing coating is produced on the substrate. The coating smooths the irregular surfaces of various substrates, has a low defect density, excellent adhesion, high density, and minimal stress. As such, the coatings are useful on electronic devices as protective coatings, as corrosion resistant and abrasion resistant coatings, as temperature and moisture resistant coatings, as dielectric layers in, for instance, multilayer devices and as a diffusion barriers against ionic impurities such as sodium and chloride.

In addition, this planarizing silica coating may be covered by other coatings such as further $SiO_2$ coatings, $SiO_2$/modifying ceramic oxide layers, silicon containing coatings, silicon carbon containing coatings, silicon nitrogen containing coatings, diamond -like carbon coatings and/or silicon nitrogen carbon containing coatings.

The following non-limiting examples are included so that one skilled in the art may more readily understand the invention.

EXAMPLE 1

Hydrogen silsesquioxane resin made by the method of Collins et al. in U.S. Pat. No. 3,615,272 was diluted to 10 weight percent solids in a cyclic dimethylsiloxane solvent. A platinum catalyst comprising platinum acetylacetonate in toluene was added to the solution at a concentration of approximately 100 ppm platinum based on the weight of H-resin.

Approximately 100 microliters of the above H-resin solution was applied to the surface of 1 inch square silicon wafers and the wafers were spun at 3000 rpm for 10 seconds.

The wafer was then exposed to the radiation from an AG Associates Heat Pulse RTP system. This system comprises a radiation transparent quartz tube which is used as a protective and isolative pyrolysis chamber and contains 4 pointed quartz pins used to hold the substrate. The radiation source for this system comprises a number of quartz tungsten halogen lamps, half of which are located above the quartz tube pyrolysis chamber and half of which are located below. The wavelength of the incoherent light emitted from these lamps ranges from about 0.4 to 4.0 micrometers. A pyrometer is used in this system for temperature sensing. Encasing the above components is a water cooled reflective enclosure.

The coated wafers were heated in the above equipment at temperatures of 400°, 500°, 600°, 700° and 900° C. for 5, 10 and 30 seconds in oxygen at atmospheric pressure. The amount of SiH remaining after the above exposures was then calculated using FTIR by comparing the integrated area under the SiH peak before and after RTP exposure. The following table summarizes the results.

| TEMP (°C.) | TIME (SEC) | % SiH REMAINING |
|---|---|---|
| 400 | 10 | 32.4 |
| 400 | 30 | 32.7 |
| 500 | 10 | 17.5 |
| 500 | 30 | 18.2 |
| 600 | 10 | 3.6 |
| 600 | 30 | 6.4 |
| 700 | 10 | 6.3 |
| 700 | 30 | 11.2 |
| 900 | 5 | 4.7 |
| 900 | 10 | 5.5 |

EXAMPLE 2

1 inch square silicon wafers were coated in the same manner as example 1. These wafers were exposed to the radiation from a Peak systems APL SP35X unit with a 35 kW high intensity arc lamp in an oxygen atmosphere. The wafers were heated to 300° C. for 5 and 10 minutes, 400° C. for 5 and 10 minutes, 500° C. for 1 minute and 600° C. for 1 minute.

The percent SiH remaining was measured using FTIR as in Example 1 (upper limit). In addition, however, a second estimate of percent SiH remaining was calculated correcting for the loss of material by volatilization (lower limit). The Correction was made as follows:

Area SiH Peak/thickness (angstrom) before RTP $\times$ 10000 = X
Area SiH Peak/thickness (angstrom) after RTP $\times$ 10000 = Y
Y/X $\times$ 100 = Percent SiH remaining The following table summarizes the results.

| TEMP (°C.) | TIME (min) | % SiH REMAINING (upper) | % SiH REMAINING (lower) | THICKNESS |
|---|---|---|---|---|
| 300 | 5 | 63.0 | 52.7 | 1804 A |
| 300 | 5 | 54.6 | 46.0 | 1886 A |
| 300 | 10 | 47.1 | 38.6 | 1819 A |
| 300 | 10 | 45.0 | 37.1 | 1765 A |
| 400 | 5 | 31.3 | 25.8 | 1843 A |
| 400 | 5 | 37.6 | 30.0 | 1711 A |
| 400 | 10 | 24.5 | 19.9 | 1793 A |
| 400 | 10 | 27.3 | 21.9 | 1793 A |
| 500 | 1 | 13.9 | 11.3 | 1811 A |
| 500 | 1 | 9.8 | 7.9 | 1769 A |
| 600 | 1 | 0.0 | 0.0 | 1662 A |
| 600 | 1 | 0.0 | 0.0 | 1744 A |

EXAMPLE 3

This example demonstrates that atmospheres other than oxygen can be used with RTP. Hydrogen silsesquioxane resin made by the method of Collins et al. in U.S. Pat. No. 3,615,272 was diluted to 10 weight percent solids in a solvent comprising 95% by weight heptane and 5% by weight dodecane. A platinum catalyst comprising platinum acetylacetonate in toluene was added to the solution at a concentration of approximately 100 ppm platinum based on the weight of H-resin.

1 inch square silicon wafers were coated with the above solution in the same manner as example 1. The coated wafers were exposed to RTP in the same manner as example 2 except that the effects of using a dry 100% ammonia atmosphere during RTP was compared to the oxygen atmosphere of Example 2. The percent SiH remaining was calculated in the same manner as Example 1. The following table summarizes the results.

| TEMP (°C.) | TIME (MIN) | ATMOS-PHERE | % SiH REMAINING | COATING THICKNESS |
|---|---|---|---|---|
| 410 | 2 | oxygen | 24.98 | 1930 A |
| 410 | 2 | oxygen | 27.77 | 1953 A |
| 410 | 2 | dry ammonia | 52.86 | 2491 A |
| 410 | 2 | dry ammonia | — | 2613 A |
| 340 | 3 | oxygen | 68.32 | 2037 A |
| 340 | 3 | oxygen | — | 2001 A |
| 340 | 3 | dry ammonia | 47.42 | 2220 A |
| 340 | 3 | dry ammonia | 52.25 | 2268 A |
| 250 | 5 | oxygen | 70.78 | 2160 A |
| 250 | 5 | oxygen | 67.13 | 2124 A |
| 410 | 2 | oxygen | 34.90 (1) | 2152 A |
| 410 | 2 | dry ammonia | 70.77 (1) | 2699 A |
| 410 | 2 | oxygen | 27.68 (2) | 1427 A |
| 410 | 2 | dry ammonia | 100.00 (2) | 1640 A |

(1) 2 layers of H-resin were applied
(2) cyclic dimethylsiloxane solvent substituted for heptane/dodecane mixture

EXAMPLE 4

This example demonstrates that RTP can cure thicker films for use as interlayer dielectrics. Hydrogen silsesquioxane resin made by the method of Collins et al. in U.S. Pat. No. 3,615,272 was diluted to 30 weight percent solids in cyclic dimethyl siloxane solvent. A platinum catalyst comprising platinum acetylacetonate in toluene was added to the solution at a concentration of approximately 100 ppm platinum based on the weight of H-resin.

Approximately 1 mL of the above H-resin solution was applied to the surface of 4 inch silicon wafers and the wafers were spun at 3000 rpm for 10 seconds.

The wafers were exposed to RTP in the same manner as Example 2 and the percent SiH was calculated in the same manner as the lower limit of Example 2. The following table summarizes the results.

| FILM THICKNESS (A) | | TEMP (°C.) | TIME (min) | % SiH REMAINING |
|---|---|---|---|---|
| BEFORE RTP | AFTER RTP | | | |
| 16320 | 9136 | 400 | 10 | 1.57 |
| 17545 | 9448 | 500 | 10 | 0.00 |
| 17252 | 8661 | 600 | 10 | 0.00 |

EXAMPLE 5

This example demonstrates the unexpected improvement in bond strength of CMOS devices when processed using RTP as compared to devices coated with silica by the prior art process of pyrolyzing a H-resin coating in a conventional furnace (i.e.. U.S. Pat. No.

4,756,977). Approximately 50 microliters of the H-resin solution prepared in Example 1 was applied to the surface of CMOS devices and the devices were spun at 3000 rpm for 10 seconds. The CMOS devices were then exposed to the RTP of Example 2. The bond pull strength was determined using MIL-STD-883C specification, method 2011. The following table summarizes the bond pull strengths of the 14 lead wires on each device. (minimum acceptable = 2.0)

| TEMP (°C.) | TIME (MIN) | AVG BOND STR (grams) | RANGE BOND STR (grams) | NUMBER OF DEVICES |
|---|---|---|---|---|
| 410 and 500 | 10 5 | 4.3 | 3.6–4.8 | 1 |
| 400 | 10 | 4.1 | 3.0–5.6 | 5 |
| 500 | 5 | 4.4 | 3.2–6.2 | 5 |
| 600 | 0.5 | 4.4 | 3.4–5.4 | 1 |
| 400° C. furnace for 1 hour | | 3.0 | 2.0–4.7 | 3 |
| unprocessed | | 5.5 | 4.4–6.2 | 3 |

The region where lead wires were detached from the bond pads was also examined under optical microscopy to analyze for purple plague. None was observed.

EXAMPLE 6

The following example demonstrates the unexpected decrease in coating film stress on silicon wafers when processed using RTP as compared to wafers coated with silica by the prior art process of pyrolyzing a H-resin coating in a conventional furnace (i.e., U.S. Pat. No. 4.756.977). Approximately 1 mL of the H-resin solution prepared in Example 1 was applied to the surface of 4 inch silicon wafers and spun at 3000 rpm for 10 seconds. The wafers were then exposed to the RTP of Example 2. Stress measurements were obtained from a FSM 8800 instrument which measures wafer curvature using an optically levered laser beam. The following table summarizes the results.

| TEMP (°C.) | TIME (min) | TENSILE STRESS (dynes/cm$^2$) |
|---|---|---|
| 500 | 10 | $1.099 \times 10^{-9}$ |
| 500 | 5 | $1.207 \times 10^{-9}$ |
| 400 | 10 | $1.113 \times 10^{-9}$ |
| 500 | 10 | $0.886 \times 10^{-9}$ |
| 600 | 10 | $0.806 \times 10^{-9}$ |
| O$_2$ Plasma 250° C. for 3 hours | | $2.319 \times 10^{-9}$ |
| furnace 400° C. for 3 hours | | $2.077 \times 10^{-9}$ |

EXAMPLE 7

The following example demonstrates that highly densified silica coatings are obtained using RTP. Approximately 1 mL of the H-resin solution prepared in Example 1 was applied to the surface of 4 inch silicon wafers and spun at 3000 rpm for 10 seconds. The wafers were then exposed to the RTP of Example 2. The density calculations were made by obtaining the weight of the coating using a microbalance and the thickness of the film obtained by ellipsometry. The theoretical maximum density for silica is 2.2. The following table summarizes the results.

| TEMP (°C.) | TIME (min) | ATMOSPHERE | COATING THICKNESS | DENSITY (g/cm$^3$) |
|---|---|---|---|---|
| 400 | 10 | oxygen | 1300 A | 1.857 |
| 400 | 10 | air | 1300 A | 1.810 |
| 500 | 10 | oxygen | 1450 A | 1.910 |
| 500 | 5 | oxygen | 3100 A | 1.913 |
| 400 | 10 | oxygen | 9100 A | 1.896 |
| 500 | 10 | oxygen | 9450 A | 1.988 |
| 600 | 10 | oxygen | 8700 A | 1.888 |

EXAMPLE 8

The following example compares the amount of SiH remaining after various methods of converting H-resin to silica. Approximately 100 microliters of the H-resin solution prepared in Example 1 was applied to the surface of 1 inch square silicon wafers and the wafers spun at 3000 rpm for 10 seconds. The wafers were then exposed to various conditions to facilitate conversion to silica. Percent SiH remaining was calculated by the method of Example 1. The following table summarizes the results. (RTP exposure was by the method of Example 2)

| TREATMENT | % SiH REMAINING |
|---|---|
| THICK FILMS (1.0 MICRON) | |
| 400° C. RTP for 10 min | 2 |
| 400° C. furnace for 3 hours | 20–40 |
| 250° C. oxygen plasma for 4 hours | 50–90 |
| 400° C. bottom up heating on a hot plate 1 hr | 31–50 |
| THIN FILMS (1000–3500 A) | |
| 400° C. RTP for 1–10 min | 0–10 |
| 400° C. furnace for 1 hour | 7–25 |
| 250° C. oxygen plasma for 2 hours | 8–13 |
| 400° C. bottom up heating on a hot plate 1 hr | 50 |

That which is claimed is:

1. A method of applying a silica coating to a substrate comprising
   coating the substrate with a solution comprising hydrogen silsesquioxane resin and a solvent;
   evaporating the solvent to deposit a hydrogen silsesquioxane resin coating on the substrate; and
   subjecting the coated substrate to high intensity radiation comprising incoherent light in a spectral region selected from the group consisting of visible, infrared, ultraviolet and combinations thereof, in order to heat the coated substrate sufficiently to facilitate conversion of the hydrogen silsesquioxane resin coating to a silica coating.

2. The method of claim 1 wherein the coated substrate is thermally isolated during heating and the high intensity radiation heats said coated substrate to a temperature between about 50° and about 1000° C. for between about 1 second and about 1 hour.

3. The method of claim 2 wherein the hydrogen silsesquioxane resin is selected from the group consisting of $(HSiO_{3/2})_n$, a polymer having units of the formula $HSi(OH)_aO_{3-a}/2$ and a polymer having units of the formula $HSi(OH)_x(OR)_yO_{z/2}$, wherein each R is independently an organic group which, when bonded to silicon through the oxygen atom, forms a hydrolyzable substituent, $a=0-2$, $x=0-2$, $y=0-2$, $z=1-3$, $x+y+z=3$, n is an integer greater than 3 and the average value of y over all of the units of the polymer is greater than 0.

4. The method of claim 3 wherein the solvent is selected from the group consisting of alcohols, aromatic hydrocarbons, alkanes, cyclic dimethylsiloxanes, ketones, esters or glycol ethers and is present in an amount sufficient to dissolve the hydrogen silsesquioxane resin to between about 0.1 and about 50 weight percent.

5. The method of claim 4 wherein the solution also contains a modifying ceramic oxide precursor comprising a compound containing an element selected from the group consisting of titanium, zirconium, aluminum, tantalum, vanadium, niobium, boron and phosphorous wherein the compound contains at least one hydrolyzable substituent selected from the group consisting of alkoxy or acyloxy and the compound is present in an amount such that the silica coating contains 0.1 to 30 percent by weight modifying ceramic oxide.

6. The method of claim 4 wherein the solution also contains a platinum or rhodium catalyst in an amount of about 5 to about 500 ppm platinum or rhodium based on the weight of hydrogen silsesquioxane 7. The method of claim 5 wherein the solution also contains a platinum or rhodium catalyst in an amount of about 5 to about 500 ppm platinum or rhodium based on the weight of hydrogen silsesquioxane resin.

8. The method of claim 4 wherein the high intensity radiation is derived from a tungsten halogen lamp and said radiation heats the coated substrate to a temperature between about 300° and about 900° C. for between about 1 second and about 15 minutes.

9. The method of claim 5 wherein the high intensity radiation is derived from a tungsten halogen lamp and said radiation heats the coated substrate to a temperature between about 300° and about 900° C. for between about 1 second and about 15 minutes.

10. The method of claim 6 wherein the high intensity radiation is derived from a tungsten halogen lamp and said radiation heats the coated substrate to a temperature between about 300° and about 900° C. for between about 1 second and about 15 minutes.

11. The method of claim 7 wherein the high intensity radiation is derived from a tungsten halogen lamp and said radiation heats the coated substrate to a temperature between about 300° and about 900° C. for between about 1 second and about 15 minutes.

12. The method of claim 4 wherein the high intensity radiation is derived from an arc lamp and said radiation heats the coated substrate to a temperature between about 300° and about 900° C. for between about 1 second and about 15 minutes.

13. The method of claim 5 wherein the high intensity radiation is derived from an arc lamp and said radiation heats the coated substrate to a temperature between about 300° and about 900° C. for between about 1 second and about 15 minutes.

14. The method of claim 6 wherein the high intensity radiation is derived from an arc lamp and said radiation heats the coated substrate to a temperature between about 300° and about 900° C. for between about 1 second and about 15 minutes.

15. The method of claim 7 wherein the high intensity radiation is derived from an arc lamp and said radiation heats the coated substrate to a temperature between about 300° and about 900° C. for between about 1 second and about 15 minutes.

16. The method of claim 4 wherein the high intensity radiation is derived from a graphite heater and said radiation heats the coated substrate to a temperature between about 300° and about 900° C. for between about 1 second and about 15 minutes.

17. The method of claim 5 wherein the high intensity radiation is derived from a graphite heater and said radiation heats the coated substrate to a temperature between about 300° and about 900° C. for between about 1 second and about 15 minutes.

18. The method of claim 6 wherein the high intensity radiation is derived from a graphite heater and said radiation heats the coated substrate to a temperature between about 300° and about 900° C. for between about 1 second and about 15 minutes.

19. The method of claim 7 wherein the high intensity radiation is derived from a graphite heater and said radiation heats the coated substrate to a temperature between about 300° and about 900° C. for between about 1 second and about 15 minutes.

20. The method of claim 4 wherein the coating is exposed to the high intensity radiation in an atmosphere comprising a reactive gas selected from the group consisting of air, oxygen plasma, ammonia and amines.

21. The method of claim 1 wherein the radiation has a wavelength in the range of from about 0.1 to about 4.0 micrometers.

22. The method of claim 1 wherein the hydrogen silsesquioxane resin is of the formula $(HSiO_{3/2})_n$, wherein n is an integer between about 8 and about 1000.

23. The method of claim 1 wherein the hydrogen silsesquioxane resin coating is hydrolyzed prior to being subjected to the high intensity radiation.

* * * * *